(12) United States Patent
Noto et al.

(10) Patent No.: US 7,553,685 B2
(45) Date of Patent: Jun. 30, 2009

(54) METHOD OF FABRICATING LIGHT-EMITTING DEVICE AND LIGHT-EMITTING DEVICE

(75) Inventors: Nobuhiko Noto, Annaka (JP); Masato Yamada, Annaka (JP); Shinji Nozaki, Kawasaki (JP); Kazuo Uchida, Tokyo (JP); Hiroshi Morisaki, Tsurugashima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 324 days.

(21) Appl. No.: 10/523,636
(22) PCT Filed: Aug. 6, 2003
(86) PCT No.: PCT/JP03/09979
§ 371 (c)(1), (2), (4) Date: Feb. 4, 2005
(87) PCT Pub. No.: WO2004/015785
PCT Pub. Date: Feb. 19, 2004

(65) Prior Publication Data
US 2005/0285127 A1 Dec. 29, 2005

(30) Foreign Application Priority Data
Aug. 7, 2002 (JP) .............................. 2002-230343

(51) Int. Cl.
*H01L 21/00* (2006.01)
(52) U.S. Cl. ......................................... 438/46; 257/96
(58) Field of Classification Search ................. 438/605, 438/608, 46, 47; 257/96
See application file for complete search history.

(56) References Cited

U.S. PATENT DOCUMENTS 5,481,122 A   1/1996 Jou et al.

(Continued)

FOREIGN PATENT DOCUMENTS

JP   1-225178   9/1989

(Continued)

OTHER PUBLICATIONS

Bass et al., Handbook of Optics, McGraw-Hill Inc., vol. 1, Chapter 12: Light-Emitting Diodes, pp. 12.1-12.39.*
Lakhani, A.; The role of compound formation and heteroepitaxy in indium-based ohmic contacts to GaAs; Sep. 15, 1984; J. Appl. Phys.; vol. 56, pp. 1888-1891.*

*Primary Examiner*—W. David Coleman
*Assistant Examiner*—Vicki B Booker
(74) *Attorney, Agent, or Firm*—Oliff & Berridge, PLC

(57) ABSTRACT

A light-emitting device 100 has ITO transparent electrode layers 8, 10 used for applying drive voltage for light-emission to a light-emitting layer section 24, and is designed so as to extract light from the light-emitting layer section 24 through the ITO transparent electrode layers 8, 10. The light-emitting device 100 also has contact layers composed of In-containing GaAs, formed between the light-emitting layer section 24 and the ITO transparent electrode layers 8, 10, so as to contact with the ITO transparent electrode layers respectively. The contact layers 7, 9 are formed by annealing a stack 13 obtained by forming GaAs layers 7', 9' on the light-emitting layer section, and by forming the ITO transparent electrode layers 8, 10 so as to contact with the GaAs layers 7', 9', to thereby allow In to diffuse from the ITO transparent electrode layers 8, 10 into the GaAs layers 7', 9'. This provides a method of fabricating a light-emitting device, in which the ITO transparent electrode layers as the light-emission drive electrodes are bonded as being underlain by the contact layers, to thereby reduce contact resistance of these electrodes, and to thereby make the contact layers less susceptible to difference in the lattice constants with those of the light-emitting layer section during the formation thereof.

18 Claims, 8 Drawing Sheets

U.S. PATENT DOCUMENTS

| | | | |
|---|---|---|---|
| 6,057,562 A | 5/2000 | Lee et al. | |
| 6,121,635 A | 9/2000 | Watanabe et al. | |
| 6,225,648 B1 * | 5/2001 | Hsieh et al. | 257/95 |
| 6,350,997 B1 | 2/2002 | Saeki | |
| 6,483,127 B2 * | 11/2002 | Saeki | 257/96 |
| 6,787,383 B2 * | 9/2004 | Ikeda et al. | 438/44 |

FOREIGN PATENT DOCUMENTS

| | | |
|---|---|---|
| JP | 5-190893 | 7/1993 |
| JP | 1992-355541 * | 7/1994 |
| JP | 7-66455 | 3/1995 |
| JP | 6-188455 | 7/1995 |
| JP | 11-4020 | 1/1999 |
| JP | 11-17220 | 1/1999 |
| JP | 11-307810 | 11/1999 |
| JP | 2000-196152 | 7/2000 |
| JP | 2001-144322 | 5/2001 |
| JP | 2001-223384 | 8/2001 |
| JP | 2003-174197 | 6/2003 |
| TW | 565954 B | 12/2003 |

* cited by examiner (before bonding)　　　(after bonding)

$A=(Al_{0.5}Ga_{0.5})_{0.5}In_{0.5}P$ $B=(Al_{0.2}Ga_{0.8})_{0.5}In_{0.5}P$

METHOD OF FABRICATING LIGHT-EMITTING DEVICE AND LIGHT-EMITTING DEVICE

TECHNICAL FIELD

This invention relates to a method of fabricating a light-emitting device, and a light-emitting device.

BACKGROUND ART

Of various semiconductor light-emitting devices having a light-emitting layer section composed of compound semiconductors formed therein, those used as light-emitting diode light sources for display or lighting have a metal electrode applying drive voltage to the light-extraction surface side of the light-emitting layer section formed therein. The metal electrode acts as a light interceptor, and is typically formed so as to cover only the center portion of the main surface of the light-emitting layer section, so as to make it possible to extract the light from the surrounding non-electrode-forming area. The metal electrode, however, remains as a light interceptor, and raises another problem in that an extreme reduction in the electrode area inhibits current spreading in the device plane, and undesirably limits the extractable light energy. It has, therefore, been proposed that the entire surface of the light-emitting layer section is covered with an ITO (indium tin oxide) transparent electrode layer having a high electro-conductivity, aiming at achieving both of improvement in the light extraction efficiency through the transparent electrode layer and improvement in the current spreading effect, as typically disclosed in Japanese Laid-Open Patent Publication "Tokkaihei" Nos. 1-225178 and 6-188455.

Both publications pointed out a problem in that formation of the ITO transparent electrode layer directly on the light-emitting layer section results in an excessively high contact resistance, and disables operation at an appropriate operation voltage. Japanese Laid-Open Patent Publication "Tokkaihei" No. 1-225178 discloses a method of epitaxially growing a contact layer composed of $In_xGa_{1-x}As$ (also referred to as InGaAs, hereinafter) directly on the light-emitting layer section by the MOVPE (metal-organic vapor phase epitaxy) process, and further forming thereon the ITO transparent electrode layer. On the other hand, Japanese Laid-Open Patent Publication "Tokkaihei" No. 6-188455 discloses a method of epitaxially growing a GaAs layer on the light-emitting layer section by the MOVPE process, forming thereon the ITO transparent electrode layer, and then annealing it.

This invention is to provide a method of fabricating a light-emitting device, in which the ITO transparent electrode layers as the light-emission drive electrodes are bonded as being underlain by the contact layers, to thereby reduce contact resistance of these electrodes, and to thereby make the contact layers less susceptible to difference in the lattice constants with those of the light-emitting layer section during the formation thereof, and also to provide a light-emitting device further improved in the performance through structural improvement in the contact layer.

The InGaAs contact layer formed by the MOVPE process adopted in the aforementioned prior arts differs in the lattice constants by as large as 4% or around in maximum on the alloy composition basis, from those of a compound semiconductor composing the light-emitting layer section, such as GaAs, or AlGaAs or AlGaInP grown epitaxially on a GaAs substrate. This raises problems below.

(1) This is highly causative of quality degradation such as lowering in the light emission efficiency, due to lattice mismatching between the InGaAs contact layer and the light-emitting layer section.

(2) It is difficult for the method disclosed in Japanese Laid-Open Patent Publication "Tokkaihei" No. 1-225178, in which the InGaAs contact layer is directly grown by epitaxy, to uniformly grow the contact layer, due to the above-described difference in the lattice constants with those of the light-emitting layer section, and this tends to result in island-patterned film formation, to thereby fail in securing a satisfactory contact with the ITO transparent electrode layer. On the other hand, an embodiment disclosed in Japanese Laid-Open Patent Publication "Tokkaihei" No. 6-188455, in which the ITO transparent electrode layer is formed and then annealed, adopts an annealing temperature of as high as 800° C., and an annealing time of as long as 5 minutes.

SUMMARY OF THE INVENTION

Aiming at solving the aforementioned problems, a method of fabricating a light-emitting device of this invention is such as fabricating a light-emitting device having a light-emitting layer section configured as having a double heterostructure in which a first conductivity type cladding layer, an active layer, and a second conductivity type cladding layer, all of which being composed of $(Al_xGa_{1-x})_yIn_{1-y}P$ (where, $0 \leq x \leq 1$, $0 \leq y \leq 1$), are stacked in this order, and further comprising an ITO transparent electrode layer applying drive voltage for light-emission to the light-emitting layer section on at least either side of the first conductivity type cladding layer and the second conductivity type cladding layer, comprising the steps of:

forming a GaAs layer on the light-emitting layer section, forming the ITO transparent electrode layer so as to contact with the GaAs layer; and annealing the stack so as to allow In to diffuse from the ITO transparent electrode layer into the GaAs layer to thereby convert it into a contact layer composed of In-containing GaAs.

The aforementioned light-emitting layer section can realize an extremely high light emission efficiency, because holes and electrons injected in the narrow active layer are confined and can efficiently recombine, due to energy barriers ascribable to difference in the band gap between the active layer and the cladding layer formed on both sides thereof. It is also made possible to realize a wide range of emission wavelength from green to red regions (with a peak emission wavelength of 520 nm to 670 nm, both ends inclusive), through compositional adjustment of the active layer composed of AlGaInP. In the method of fabricating a light-emitting device of this invention, the GaAs layer is formed on the light-emitting layer section composed of AlGaInP, and the ITO transparent electrode layer is formed so as to contact with the GaAs layer. The light-emitting layer section is typically composed of a III-V compound semiconductor, and can typically be formed by the publicly-known MOVPE process, together with the GaAs layer formed thereon (where, insertion of any other lattice-matched layer permissible). The GaAs layer can very readily be lattice-matched with the AlGaInP light-emitting layer section, and can form a uniform and highly continuous film as compared with the case of direct epitaxial growth of InGaAs disclosed in Japanese Laid-Open Patent Publication "Tokkaihei" No. 1-225178.

The ITO transparent electrode layer is then formed on the GaAs layer, and the stack is annealed so as to allow In to diffuse from the ITO transparent electrode layer into the GaAs layer, to thereby form the contact layer. The contact layer composed of In-containing GaAs thus obtained through the annealing will never have an excessive In content, and can effectively prevent quality degradation such as lowering in the emission intensity due to lattice mismatching with the light-emitting layer section. The lattice matching between the GaAs layer and the light-emitting layer section becomes particularly desirable when the light-emitting layer section is composed of $(Al_xGa_{1-x})_yIn_{1-y}P$ (where, $0 \leq x \leq 1$, $0.45 \leq y \leq 0.55$), so that it can be said desirable to form the light-emitting layer section (cladding layer or active layer) while adjusting alloy composition y within the above range.

The above-described annealing is preferably carried out so as to make an In concentration distribution in the thickness-wise direction of the contact layer continuously reduce as becoming more distant away from the ITO transparent electrode layer in the thickness-wise direction (that is, In concentration distribution is gradated), as shown by ① in FIG. 6. This type of structure can be formed by annealing so as to allow In to diffuse unidirectionally from the ITO side towards the contact layer side. A first aspect of the light-emitting device of this invention is characterized by having a light-emitting layer section configured as having a double heterostructure in which a first conductivity type cladding layer, an active layer, and a second conductivity type cladding layer, all of which being composed of $(Al_xGa_{1-x})_yIn_{1-y}P$ (where, $0 \leq x \leq 1$, $0 \leq y \leq 1$), are stacked in this order; having an ITO transparent electrode layer applying drive voltage for light-emission to the light-emitting layer section on at least either side of the first conductivity type cladding layer and the second conductivity type cladding layer, so as to extract light from the light-emitting layer section through the ITO transparent electrode layer; and having a contact layer composed of In-containing GaAs, formed between the light-emitting layer section and the ITO transparent electrode layer, as being in contact with the ITO transparent electrode layer, wherein the contact layer is designed to have an In concentration distribution in the thickness-wise direction thereof continuously reducing as becoming more distant away from the ITO transparent electrode layer in the thickness-wise direction. This means that the In concentration distribution of the contact layer is reduced on the side of the light-emitting layer section composed of AlGaInP, or in other words, difference in the lattice constants from those of the light-emitting layer section decreases. Formation of the contact layer having this sort of In concentration distribution raises an advantage of further improving the lattice matching with the light-emitting layer section. An excessively high annealing temperature, or an excessively long annealing time will fail in obtaining these effect, because this results in an excessive proceeding of the In diffusion from the ITO transparent electrode layer, and makes the In concentration distribution in the contact layer remain almost constant and at a high level in the thickness-wise direction in the contact layer, as indicated by ③ in FIG. 6 (an excessively low annealing temperature, or excessively short annealing time will result in shortage of the In concentration in the contact layer, as indicated by ② in FIG. 6).

In this case, assuming now in FIG. 6 that In concentration of the contact layer at the boundary position with the ITO transparent electrode layer as $C_A$, and In concentration at the boundary position on the opposite side as $C_B$, it is preferable to adjust $C_B/C_A$ to 0.8 or below, and it is preferable to carry out the above-described annealing so as to obtain such In concentration distribution. $C_B/C_A$ exceeding 0.8 results in only a poor improving effect of the lattice matching property with the light-emitting layer section through gradient in the In concentration distribution. If a mean In concentration $C_M$ of the contact layer can be maintained at the above-described desirable value (0.1 to 0.6, both ends inclusive) on the basis of atomic ratio of In to the total concentration of In and Ga, it is of no problem that the In concentration $C_B$ of the contact layer at the boundary position opposite to that facing to the ITO transparent electrode layer becomes zero, or in other words, that the InGaAs layer is formed on the ITO-transparent-electrode side of the contact layer, and the GaAs layer on the opposite side, as shown in FIG. 7. The thickness-wise compositional distribution of the contact layer (In or Ga concentration distribution) can be measured while gradually etching the layer in the thickness-wise direction, by publicly-known surface analytical methods such as SIMS (secondary ion mass spectroscopy), AES (Auger electron spectroscopy), and XPS (X-ray photoelectron spectroscopy). The average composition of the contact layer can be measured by calculating an integral average of concentration distribution in the thickness-wise direction.

The average In concentration of the contact layer is preferably adjusted to a range from 0.1 to 0.6 on the basis of atomic ratio of In to the total concentration of In and Ga, and it is also preferable to carry out the above-described annealing so as to achieve such average In concentration. The above-defined In concentration less than 0.1 results in only an insufficient effect of reducing contact resistance of the contact layer, and exceeding 0.6 results in a considerable degradation in the quality such as lowered light emitting intensity, due to lattice mismatching between the contact layer and the light-emitting layer section.

ITO is an indium oxide film doped with tin oxide, and adjustment of tin oxide content thereof to 1% by mass to 9% by mass (indium oxide content to 91% by mass to 99% by mass) can suppress resistivity of the electrode layer to as low enough as $5 \times 10^{-4}$ Ω·cm. Formation of this sort of ITO transparent electrode layer on the GaAs layer, and by further annealing it within an appropriate temperature range makes it possible to readily form the contact layer having the above-described desirable In concentration. The annealing is also successful in further reducing the resistivity of the ITO transparent electrode layer. The annealing is preferably carried out within a temperature range lower than that described in the Japanese Laid-Open Patent Publication "Tokkaihei" No. 1-225178, more specifically in a range from 600° C. to 750° C. The annealing temperature exceeding 750° C. results in a too large diffusion rate of In into the GaAs layer, and tends to make the In concentration in the contact layer excessive. This also results in saturation of the In concentration and makes it difficult to obtain the In concentration gradient in the thickness-wise direction in the contact layer. The both consequently worsen the lattice matching between the contact layer and the light-emitting layer section. An excessive proceeding of the In diffusion into the GaAs layer causes In depletion in the ITO transparent electrode layer at around the contact portion with the contact layer, and inevitably results in increase in the resistivity of the electrode. Furthermore, the above-described excessively high annealing temperature makes oxygen in ITO diffuse into the GaAs layer and promote oxidation, and thereby makes the series resistance of the device more likely to increase. Both cases raise nonconformity in that the light-emitting device cannot be driven at an appropriate voltage. An extremely high annealing temperature may sometimes worsen the resistivity of the ITO transparent electrode layer, against expectation. On the other hand, the annealing temperature less than 650° C. excessively lowers the diffusion rate of In into the GaAs layer, and needs an extremely long time for obtaining the contact layer lowered in the contact resistance to a satisfactory degree, and this considerably lowers efficiency in the fabrication.

The annealing time is preferably set to 5 seconds to 120 seconds, both ends inclusive. The annealing time longer than 120 seconds tends to make the amount of In diffusion into the GaAs layer excessive, especially for the case where the annealing temperature is set at a temperature close to the upper limit. It is, however, also allowable to adopt a longer annealing time (up to 300 seconds or around), if the annealing temperature is set a little lower. On the other hand, the annealing time less than 5 seconds results in only an insufficient amount of In diffusion into the GaAs layer, and makes it difficult to obtain the contact layer lowered the contact resistance to a sufficient degree.

The ITO transparent electrode layer can be formed so as to cover the entire surface of the light-emitting layer section. This configuration makes the ITO transparent electrode layer have a function of current spreading layer, and consequently makes it possible to get rid of a conventional thick current spreading layer composed of a compound semiconductor, or makes it possible to largely reduce the thickness if it is daringly formed. This contributes to the cost reduction through simplification of the process, and is very beneficial in terms of industrial application. On the other hand, the thickness of the contact layer may not so necessarily be large so far as it is thick enough to form ohmic contact. More specifically, it is all enough to secure the thickness so that the compound semiconductor composing the contact layer will never show a band gap energy different from that of the bulk crystal due to thinning of the layer, and a thickness of 0.001 μm or around will be sufficient when $In_xGa_{1-x}As$ is used. On the other hand, excessive increase in the thickness of the contact layer composed of $In_xGa_{1-x}As$ results in increase in light absorption by the contact layer, and lowers the light extraction efficiency. The thickness is therefore preferably adjusted to 0.02 μm or below. Making the contact layer as a thin layer of 0.001 μm to 0.02 μm thick is also effective in terms of moderating influences of the lattice mismatching.

Between the contact layer and either of the cladding layer of the first conductivity type cladding layer and the second conductivity type cladding layer located on the side of formation of the contact layer, an intermediate layer having an intermediate band gap energy between those of the contact layer and the cladding layer can be formed. A second aspect of the light-emitting device of this invention is characterized by having a light-emitting layer section composed of a compound semiconductor layer, and an ITO transparent electrode layer applying drive voltage for light-emission to the light-emitting layer section, so as to extract light from the light-emitting layer section through the ITO transparent electrode layer; and having a contact layer composed of In-containing GaAs, formed between the light-emitting layer section and the ITO transparent electrode layer, as being in contact with the ITO transparent electrode layer, wherein the light-emitting layer section is configured as having a double heterostructure in which a first conductivity type cladding layer, an active layer, and a second conductivity type cladding layer are stacked in this order; a contact layer is formed between at least either one of the first conductivity type cladding layer and the second conductivity type cladding layer, and the ITO transparent electrode layer; and, between the contact layer and either cladding layer of the first conductivity type cladding layer and the second conductivity type cladding layer located on the side of formation of the contact layer, an intermediate layer having an intermediate band gap energy between those of the contact layer and the cladding layer is formed.

It is necessary for the light-emitting layer section in the double heterostructure to raise the barrier height between the cladding layer and the active layer to a certain level or more, in order to enhance the carrier confinement effect in the active layer, to thereby improve the internal quantum efficiency. As shown in a schematic band chart of FIG. 10 (Ec and Ev express energy levels at the bottom of the conduction band, and at the top of the valence band, respectively), direct bonding of the contact layer to the cladding layer sometimes results in formation of a relatively high heterobarrier between the cladding layer and the contact layer due to bonding-induced bend of the band. The barrier height ΔE increases as the band edge discontinuity between the cladding layer and the contact layer increases, and is advantageous in inhibiting movement of carriers, in particular holes having a larger effective mass. For an exemplary case where a metal electrode is used, the electrode must be formed so as to attain a partial coverage, because the total coverage by the metal electrode disables the light extraction. In this case, in order to improve the light extraction efficiency, it is necessary to enhance the in-plane current spreading outwardly from the electrode. The metal electrode is often formed on the light-emitting layer section while placing the contact layer such as GaAs in between, wherein the formation of an appropriately high barrier height between the contact layer and the light-emitting layer section is advantageous for the metal electrode, because the in-plane current spreading can be promoted by virtue of the carrier dam-up effect of the barrier. The formation of high barrier height inevitably increases series resistance.

On the contrary, there is no need of considering the carrier dam-up effect by the barrier when the ITO transparent electrode layer is used, because the ITO transparent electrode layer per se has an extremely large current spreading ability. What is better, adoption of the ITO transparent electrode layer is successful in considerably increasing area of the light extraction region as compared with that for the case where the metal electrode is used. Insertion, between the contact layer and the cladding layer, of the intermediate layer having a band gap energy intermediate of those of the contact layer and the cladding layer, as shown in FIG. 11, reduces band edge discontinuity values between the contact layer and the intermediate layer, and between the intermediate layer and the cladding layer, respectively, and thereby the individual barrier heights ΔE formed therebetween become small. This is consequently successful in moderating the series resistance, and in achieving a sufficiently large light emitting intensity at a low drive voltage.

Effects of adoption of the configuration according to the second aspect of the light-emitting device of this invention becomes eminent, in particular for the case where the light-emitting layer section in the double heterostructure is composed of AlGaInP which shows a relatively desirable lattice matching property with In-containing GaAs composing the contact layer. In this case, a layer containing at least any one of an AlGaAs layer, a GaInP layer and an AlGaInP layer (having compositions adjusted so as to make the band gap energies smaller than that of the cladding layer) can preferably be adopted as the intermediate layer having a band gap energy intermediate of those of the light-emitting layer section and the contact layer composed of In-containing GaAs layer, and the intermediate layer can be configured typically as including the AlGaAs layer. It is also adoptable to any other light-emitting layer section, such as the light-emitting layer section having a double heterostructure composed of $In_xGa_yAl_{1-x-y}N$. This light-emitting layer section can realize an emission wavelength ranging from ultraviolet region to red region (peak emission wavelength resides in a range from 300 nm to 700 nm), depending on compositional adjustment of the active layer. In this case, a layer typically containing an InGaAlN layer (having composition adjusted so as to make the band gap energy smaller than that of the cladding layer) can preferably be adopted as the intermediate layer. In view of maximizing the effects of lowering the drive voltage and improving the light extraction efficiency, it is preferable to adopt a configuration in which the intermediate layer and the contact layer are formed over the entire surface of the light-emitting layer section, and the ITO transparent electrode layer is formed over the entire surface of the contact layer.

BEST MODES FOR CARRYING OUT THE INVENTION

The following paragraphs will describe best modes for carrying out this invention, referring to the attached drawings.

Figure 1:
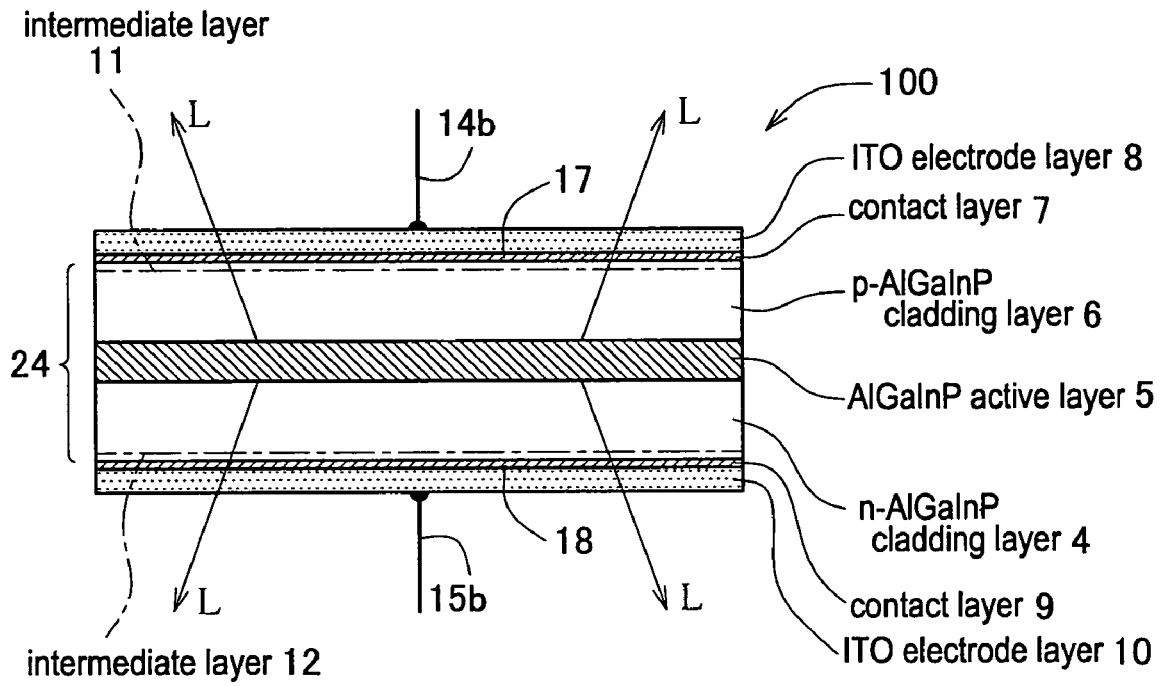
FIG. 1 is a schematic view showing a stacked structure of an exemplary light-emitting device of this invention.

FIG. 1 is a conceptual drawing showing a light-emitting device 100 according to one embodiment of this invention. The light-emitting device 100 has a contact layer 7 and an ITO transparent electrode layer 8 formed in this order, on a first main surface 17 side of a light-emitting layer section 24. On a second main surface 18 side of the light-emitting layer section 24, a contact layer 9 and an ITO transparent electrode layer 10 are formed in this order. The ITO transparent electrode layers 8, 10 are formed, together with the contact layer 7 and the contact layer 9, so as to cover the individual entire surfaces on both main surfaces 17, 18 sides of the light-emitting layer section 24.

The light-emitting layer section 24 has a double heterostructure comprising a first conductivity type cladding layer 6, a second conductivity type cladding layer 4, and an active layer disposed between the first conductivity type cladding layer 6 and the second conductivity type cladding layer 4, all of which being composed of $(Al_xGa_{1-x})_yIn_{1-y}P$ (where, $0 \leq x \leq 1, 0 \leq y \leq 1$). More specifically, it is configured by placing the active layer 5 composed of non-doped $(Al_xGa_{1-x})_yIn_{1-y}P$ (where, $0 \leq x \leq 0.55$, $0.45 \leq y \leq 0.55$) between the p-type $(Al_xGa_{1-x})_yIn_{1-y}P$ cladding layer 6 and the n-type $(Al_xGa_{1-x})_yIn_{1-y}P$ cladding layer 4, respectively having a band gap energy larger than that of the active layer 5. In the light-emitting device 100 shown in FIG. 1, the p-type AlGaInP cladding layer 6 is disposed on the ITO transparent electrode layer 8 side, and the n-type AlGaInP cladding layer 4 is disposed on the ITO transparent electrode layer 10 side. The ITO transparent electrode layer 8 side therefore has a positive polarity under current supply. It is to be noted, although obvious for those skilled in the art, that "non-doped" referred to herein means "not intentionally added with a dopant", and never excludes possibility of any dopant components inevitably included in the normal fabrication process (up to $10^{13}$ to $10^{16}/cm^3$ or around, for example).

Figure 6:
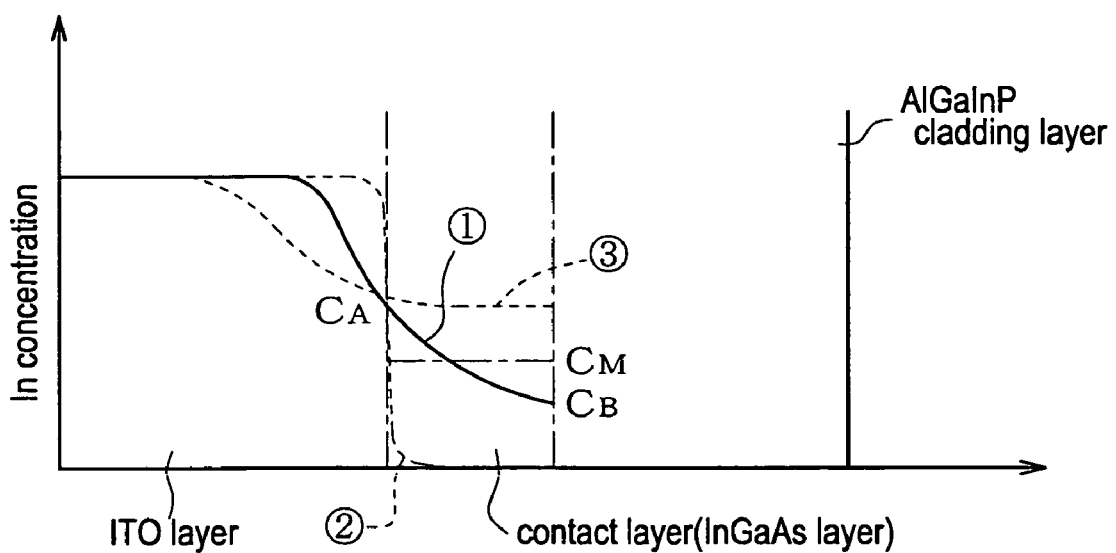
FIG. 6 is a schematic chart showing an exemplary In concentration distribution of a contact layer, together with a comparative example.

Both of the contact layers 7, 9 are composed of In-containing GaAs, and a mean In concentration $C_M$ is adjusted to 0.1 to 0.6 on the basis of atomic ratio of In to the total concentration of In and Ga, in ① shown in FIG. 6. The In concentration continuously reduces as becoming more distant away from the ITO transparent electrode layer in the thickness-wise direction, and is adjusted so as to make $C_B/C_A$ fall on 0.8 or below, where $C_A$ is In concentration at the individual boundary positions with the ITO transparent electrode layers 8, 10 (FIG. 1), and $C_B$ is In concentration at the boundary position on the opposite side (i.e., individual boundary positions with the cladding layers 6, 4 (FIG. 1)). Thickness of the contact layers 7, 9 is adjusted within a range from 0.001 μm to 0.02 μm (more preferably from 0.005 μm to 0.01 μm).

In the light-emitting device 100 shown in FIG. 1, specific examples of the thickness of the individual layers can be given as below:

contact layer 7=thickness: approx. 0.005 μm;

ITO transparent electrode layer 8=thickness: 0.4 μm, tin oxide content: 7% by mass (and the balance of indium oxide);

p-type AlGaInP cladding layer 6= 1 μm;

AlGaInP active layer 5= 0.6 μm;

n-type AlGaInP cladding layer 4= 1 μm;

contact layer 9= thickness: approx. 0.005 μm; and

ITO transparent electrode layer 10= same configuration with the ITO transparent electrode layer 8.

The following paragraphs will describe the method of fabricating the light-emitting device 100 shown in FIG. 1.

Figure 3:
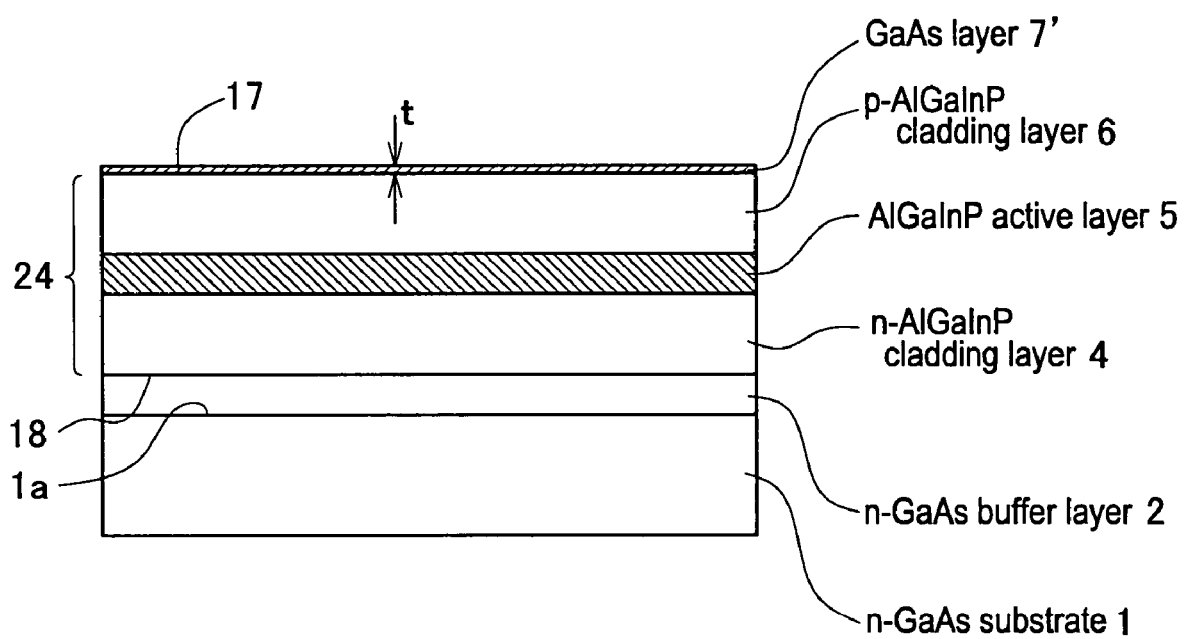
FIG. 3 is a schematic view showing a fabrication process of the light-emitting device shown in FIG. 1.

First, as shown in FIG. 3, on a first main surface 1a of a GaAs single crystal substrate 1, which is a compound semiconductor single crystal substrate allowing lattice matching with AlGaInP mixed alloy, an n-type GaAs buffer layer 2 of typically 0.5 μm thick is epitaxially grown, and further thereon, as a light-emitting layer section 24, the n-type AlGaInP cladding layer 4 of 1 μm thick, the AlGaInP active layer (non-doped) 5 of 0.6 μm thick, the p-type AlGaInP cladding layer 6 of 1 μm thick are epitaxially grown, and further on the p-type AlGaInP cladding layer 6, a GaAs layer 7' of 0.005 μm is epitaxially grown. The epitaxial growth of the individual layers can be carried out by the publicly-known MOVPE process.

Figure 4A:
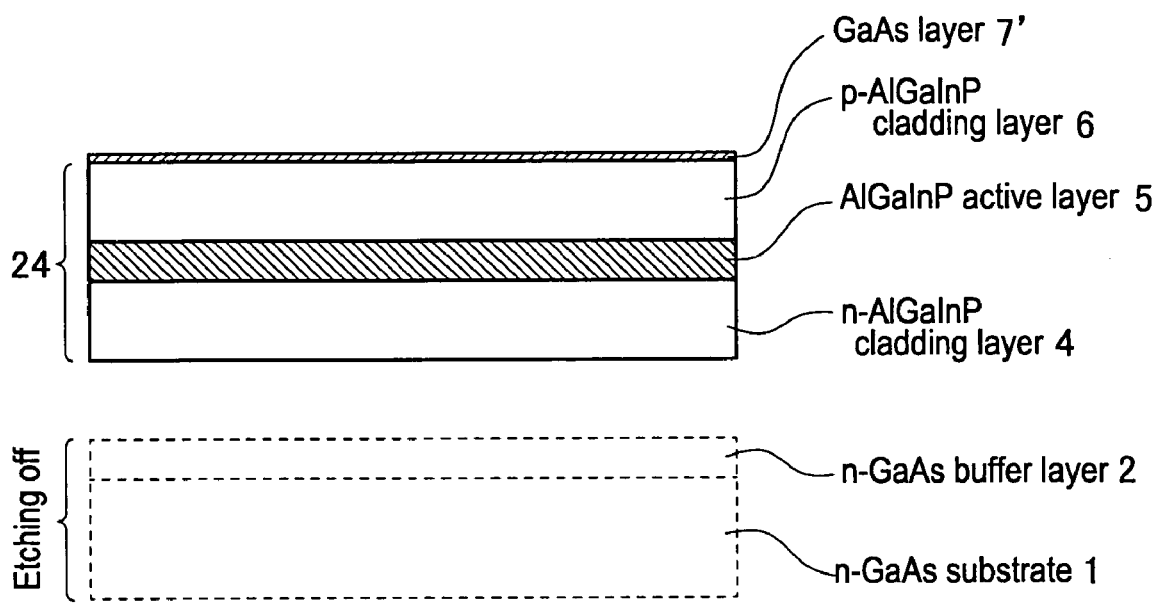
FIG. 4A is a schematic view as continued from FIG. 3.
Figure 4B:
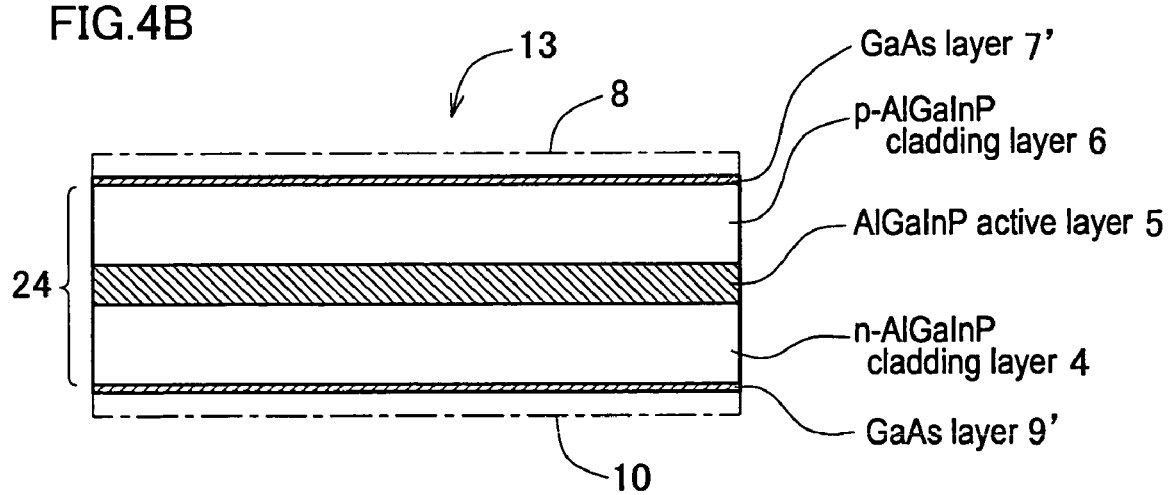
FIG. 4B is a schematic view as continued from FIG. 4A.

After the growth, the product is dipped in an etching solution typically composed of a sulfuric-acid-base aqueous solution (concentrated sulfuric acid: 30% aqueous hydrogen peroxide solution: water=3:1:1 capacity ratio), to thereby etch off the GaAs substrate 1 and the GaAs buffer layer 2 (FIG. 4A). Then as shown in FIG. 4B, on the main surface 18 of the n-type AlGaInP cladding layer 4 on the etched-off side, a GaAs layer 9' of 0.005 μm is epitaxially grown by the MOVPE process.

Respectively on both main surfaces of the GaAs layer 7' and the GaAs layer 9', the ITO transparent electrode layers 8, 10 respectively having a thickness of 0.4 μm are formed by the publicly-known RF sputtering process (target composition ($In_2O_3$=90.2% by weight, $SnO_2$=9.8% by weight), an RF frequency of 13.56 MHz, an Ar pressure of 0.6 Pa, and a sputtering power of 30 W), to thereby obtain a stacked wafer 13.

Figure 5:
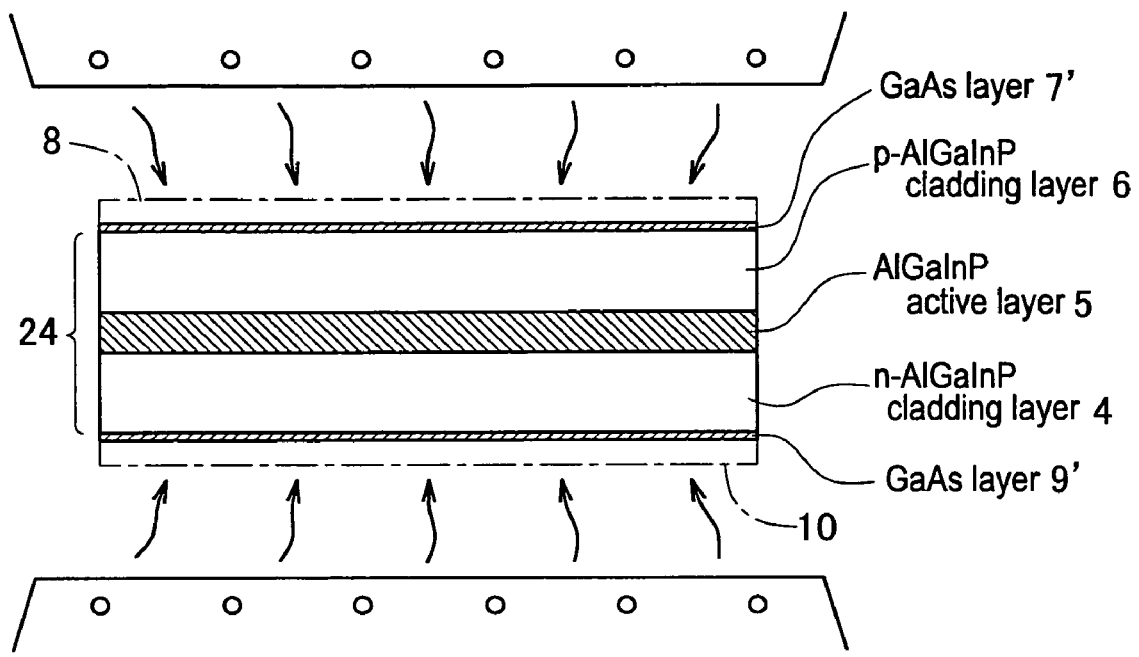
FIG. 5 is a schematic view as continued from FIG. 4B.

The stacked wafer 13 is then placed in a furnace F as shown in FIG. 5, and annealed typically in a nitrogen atmosphere or in an atmosphere of inert gas such as Ar, at an annealing temperature as low as 600° C. to 750° C. or below (700° C., for example), and for an annealing time as short as 5 seconds to 120 seconds (30 seconds, for example). This allows In to diffuse from the ITO transparent electrode layers 8, 10 into the GaAs layers 7', 9', to thereby obtain the contact layers 7, 9 having the In concentration distribution shown in FIG. 6 (or FIG. 7). The annealed stacked wafer 13 is diced to produce semiconductor chips, each chip is fixed on a support, attached with lead wires 14b, 15b as shown in FIG. 1, and molded by forming a resin molding portion not shown, to thereby produce the light-emitting device 100.

In the above-described light-emitting device 100, the entire surfaces of the p-type AlGaInP cladding layer 6 and the n-type AlGaInP cladding layer 4 are covered with the ITO transparent electrode layer 8 and the ITO transparent electrode layer 10, respectively, while placing the contact layer 7 and the contact layer 9 in between, wherein drive voltage is supplied through the ITO transparent electrode layers 8, 10. Drive current ascribable to the drive voltage can uniformly spread over the entire surface of the ITO transparent electrode layers 8, 10 having an excellent electro-conductivity, and this is successful in obtaining a uniform light emission over the entire portion of the light extraction surface (both main surfaces 17, 18), and in improving the light extraction efficiency by virtue of transparency of the electrodes 8, 10. Other advantages reside in that the series resistance of the contact portion can be suppressed to a small level, and in that the emission efficiency can be raised to a considerable degree, because the ITO transparent electrode layers 8, 10 can establish ohmic contact state with the contact layers 7, 9 having a relatively small band gap. This also successfully gets rid of any thick current spreading layer, shortens the distance between the ITO transparent electrode layer and the light emission surface, and thereby reduces the series resistance.

The contact layers 7, 9 are first formed as the GaAs layers 7', 9' having a desirable lattice matching property with the light-emitting layer section 24 composed of AlGaInP, and is then annealed at a relatively low temperature for a short period of time, so as to have an In content not excessive, but uniform and continuous enough. This is successful in effectively preventing quality degradation such as lowered light emitting intensity, due to lattice mismatching with the light-emitting layer section 24.

Figure 7:
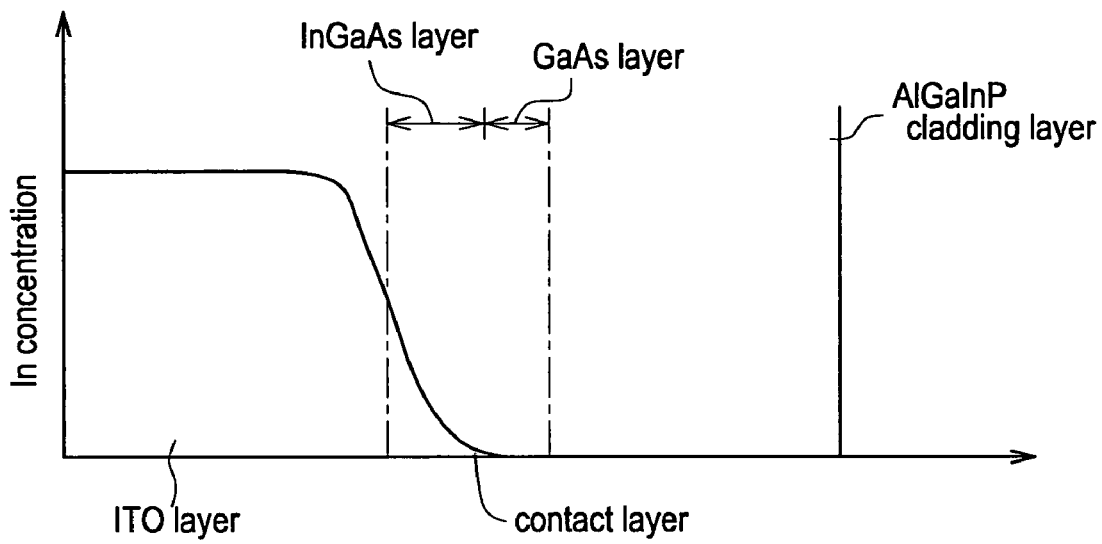
FIG. 7 is a schematic chart showing another exemplary In concentration distribution of the contact layer.

The contact layers 7, 9 may be formed by adding an appropriate dopant as those respectively having the conductivity types same with those of the cladding layers 6, 4 in contact therewith, wherein this way of formation is adoptable without problems, because the contact layers 7, 9 formed as this sort of thin films will not result in an excessive increase in the series resistance if they are formed as a low-doped layer having a low dopant concentration (e.g., $10^{17}/cm^3$ or below; or non-doped layer ($10^{13}/cm^3$ to $10^{16}/cm^3$). Moreover, the low-doped layer can achieve the effects described below, depending on the drive voltage of the light-emitting device. The contact layer configured as a low-doped layer is consequently raised in the resistivity per se, so that electric field (or, voltage per unit distance) applied in the thickness-wise direction of the contact layer will become relatively higher than those applied to the cladding layer or to the ITO transparent electrode layers 8, 10 holding the contact layer in between and having smaller values of resistivity. The contact layer herein configured using In-containing GaAs having a relatively small band gap results in an appropriate bend in the band structure of the contact layer under the applied electric field, and is successful in forming a better ohmic contact. This effect is made more distinct by virtue of the In concentration of the contact layers 7, 9 increased on the contact side with the ITO transparent electrode layers 8, 10, as shown in FIG. 6 or FIG. 7.

It is supposed herein that direct bonding of an InGaAs layer and an AlGaInP layer may result in formation of a somewhat higher heterobarrier at the bonded interface, and this may consequently raise the series resistance component. For the purpose of reducing the resistivity, it is allowable to respectively insert, between the contact layers 7, 9 in contact with the ITO transparent electrode layers 8, 10 and the AlGaInP cladding layers 6, 4, intermediate layers 11, 12 having a band gap energy intermediate of those of the both, as indicated by dashed lines in FIG. 1. The intermediate layers 11, 12 can be configured typically as containing at least any one of AlGaAs, GaInP and AlGaInP, and it is also allowable to configure the entire portion of each of the intermediate layers as a single AlGaAs layer. Even for the case where such configuration is adopted, thickness of each of the intermediate layers can be adjusted to as small as approximately 0.1 μm or below (0.01 μm or above: further thinning results in disappearance of the band structure of the bulk, and fails in obtaining a desired bonded structure), so that the thinning of the layer is successful in shortening the epitaxial growth time, improving the productivity, and reducing a risk of lowering the emission efficiency through reduction in increase in the series resistance due to formation of the intermediate layers.

Figure 2:
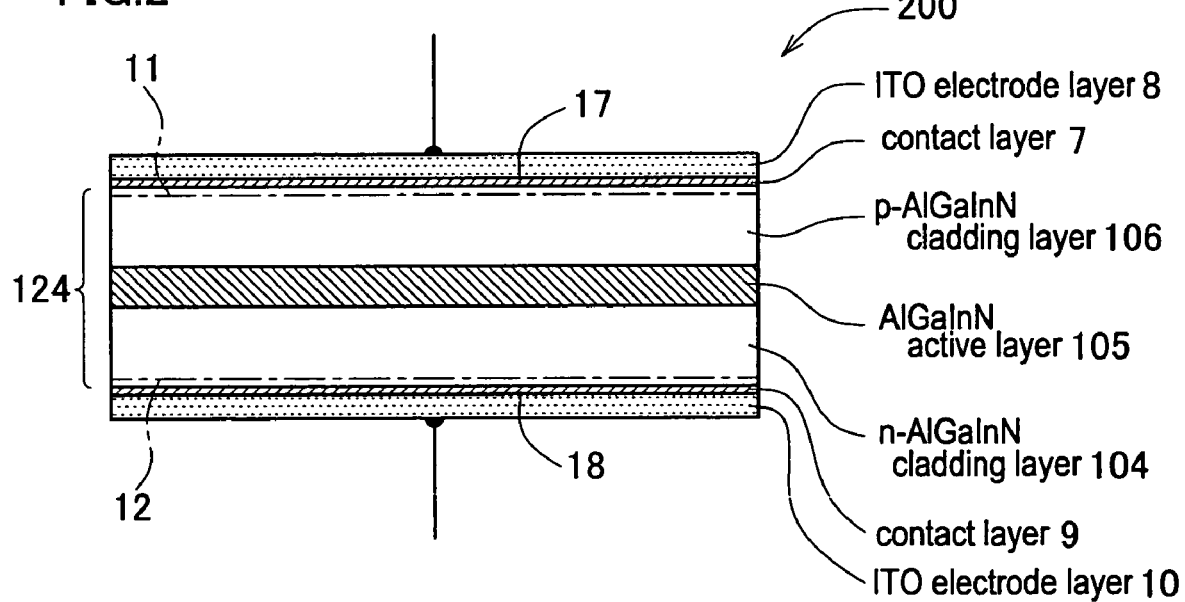
FIG. 2 is a schematic view showing a stacked structure of another exemplary light-emitting device of this invention.

The light-emitting device having this sort of intermediate layers 11, 12 formed therein can be configured as a wide-gap-type, light-emitting device 200 for blue to ultraviolet emission, in which the individual layers (a p-type cladding layer 106, an active layer 105, and an n-type cladding layer 104) of a double heterostructured light-emitting layer section 124, shown in FIG. 2, are formed using AlGaInN alloyed crystal. The light-emitting layer section 124 is formed by the MOVPE process, similarly to the case of the light-emitting device 100 shown in FIG. 1. The configuration of the light-emitting device 200 shown in FIG. 2 is equivalent to that of the light-emitting device 100 shown in FIG. 1, except for the light-emitting layer section 124, so that this will not be detailed below.

Figure 8:
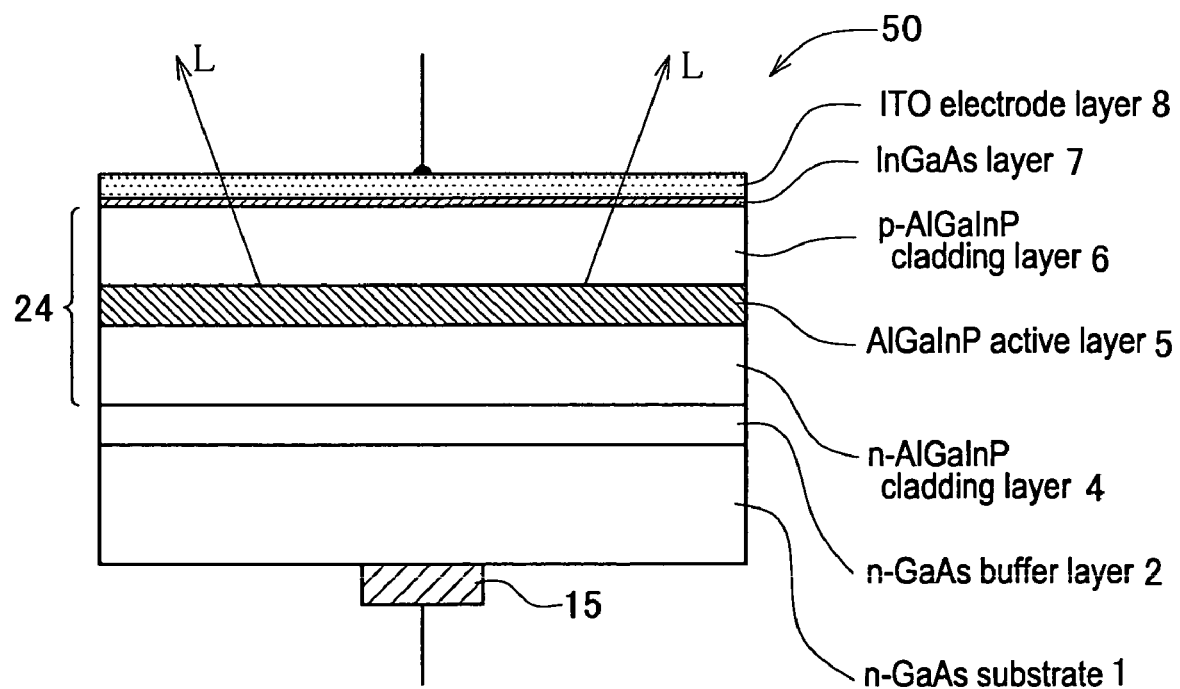
FIG. 8 is a schematic view showing an exemplary device configuration in which the contact layer and an ITO transparent electrode layer are formed only on a first main surface of a light-emitting layer section.

It is to be noted that, as shown by a light-emitting device 50 shown in FIG. 8, the light-emitting layer section 24 having the double heterostructured layer may also be bonded with the contact layer and the ITO transparent electrode layer only on one side thereof. In this case, the n-type GaAs substrate 1 is used as the device substrate, and will have the contact layer 7 and the ITO transparent electrode layer 8 formed on the first main surface side thereof.

Figure 9:
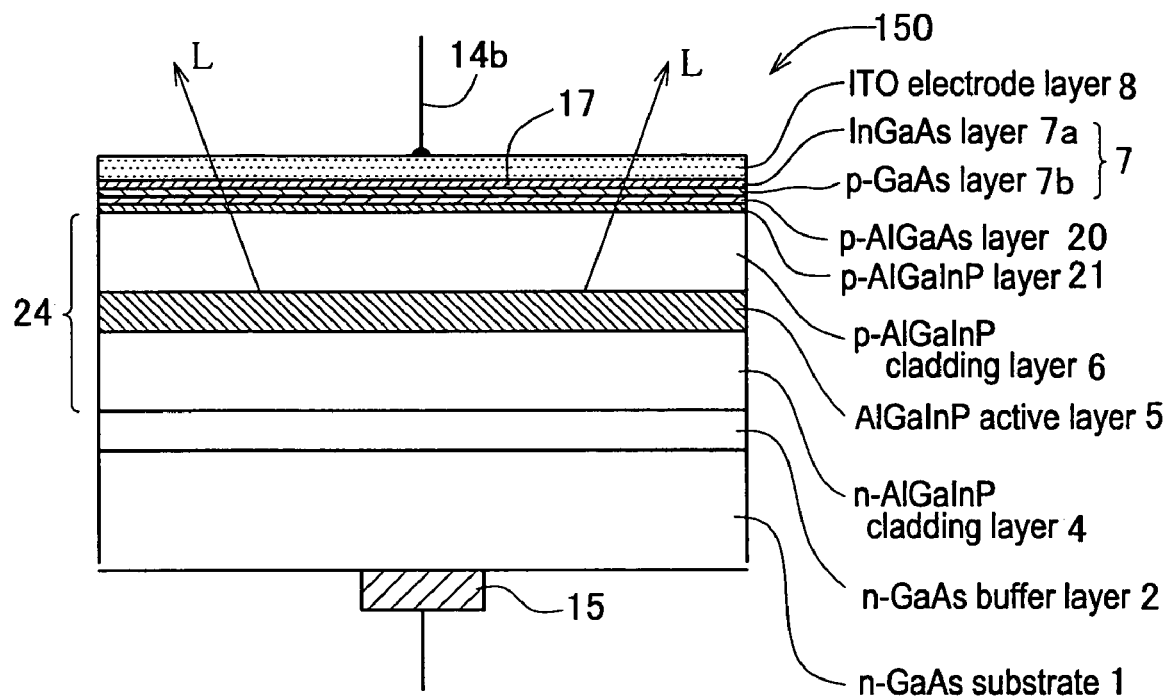
FIG. 9 is a schematic view showing an exemplary device configuration in which an intermediate layer is inserted between the contact layer and the cladding layer on the light extraction surface side shown in FIG. 8.
Figure 10:
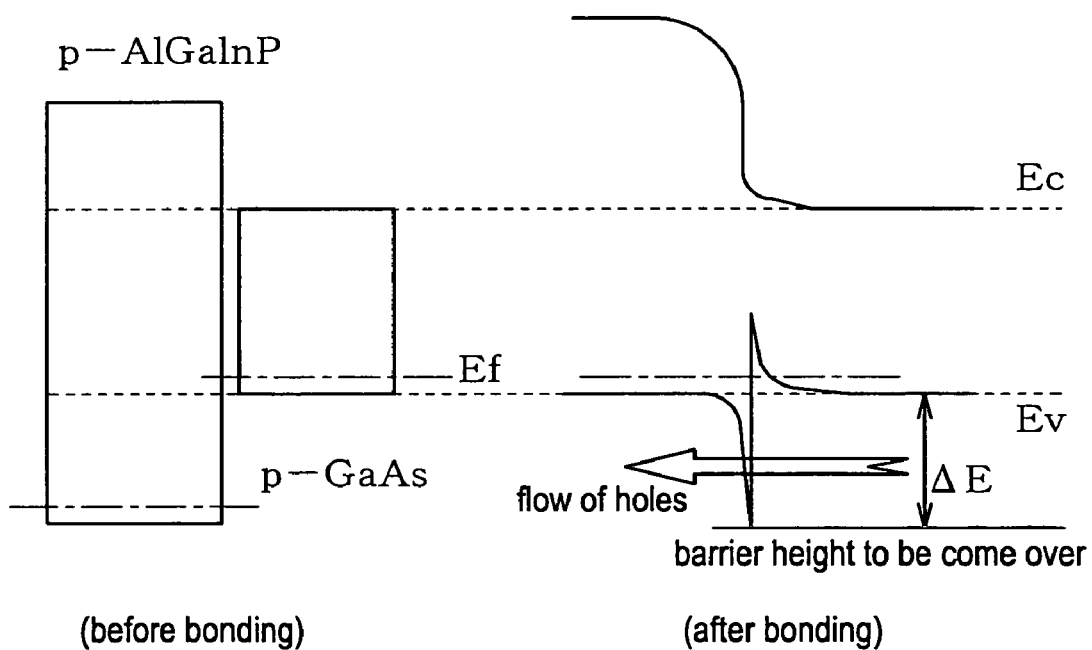
FIG. 10 is a schematic drawing showing a first example of a band structure of the contact layer.
Figure 11:
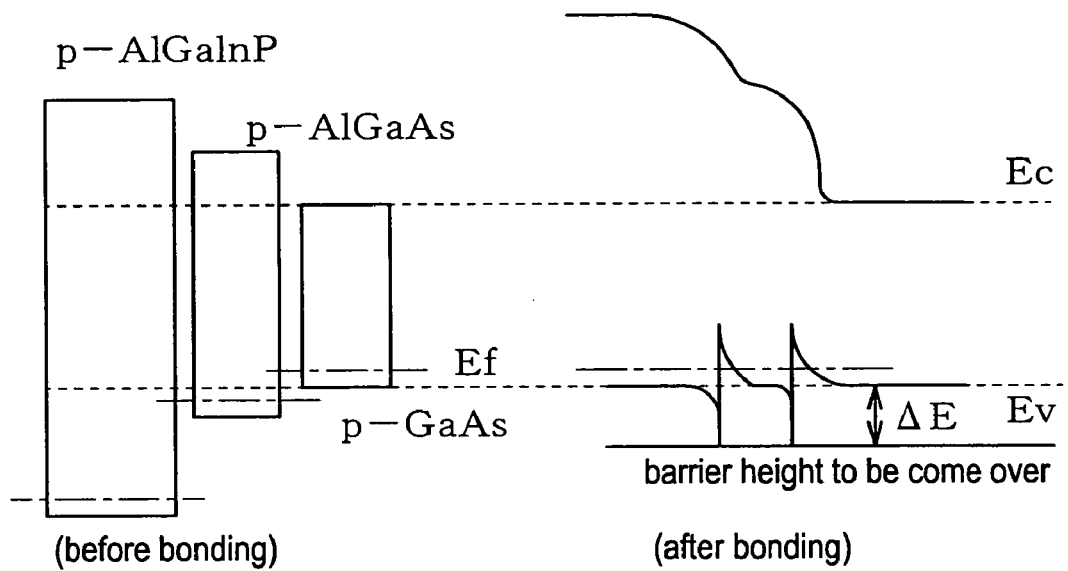
FIG. 11 is a schematic drawing showing a second example of a band structure of the contact layer.

FIG. 9 shows an example having, with respect to the ITO transparent electrode layer 8 on the light extraction surface side, the intermediate layers 20, 21 formed between the contact layer 7 and the cladding layer 6. The contact layer 7 is composed of an InGaAs layer and a GaAs layer, as shown in FIG. 7, which contribute to reduction in the band edge discontinuity value. The intermediate layers 20, 21 are composed of a plurality of layers, which are two layers of an AlGaAs layer 20 and an AlGaInP layer 21 in this embodiment, having the band gap energies step-wisely reduced towards the cladding layer side (a single layer having a continuously decreasing band gap energy is also allowable), similarly contributing to reduction in the band end discontinuity. In particular for the case where the active layer of the light-emitting layer section 24 has a large band gap energy, or in other words, has a short emission wavelength, it is inevitably necessary to increase the band gap energy also on the cladding layer side, in order to ensure the a necessary-and-enough level of band edge discontinuity for securing the carrier confinement effect also on the active layer side (use of AlGaInP, for example, needs use of a cladding layer having a large Al content). This case results in increase also in the barrier height formed at the boundary with the contact layer, so that use of the plurality of intermediate layers 20, 21 makes a great sense.

Figure 12:
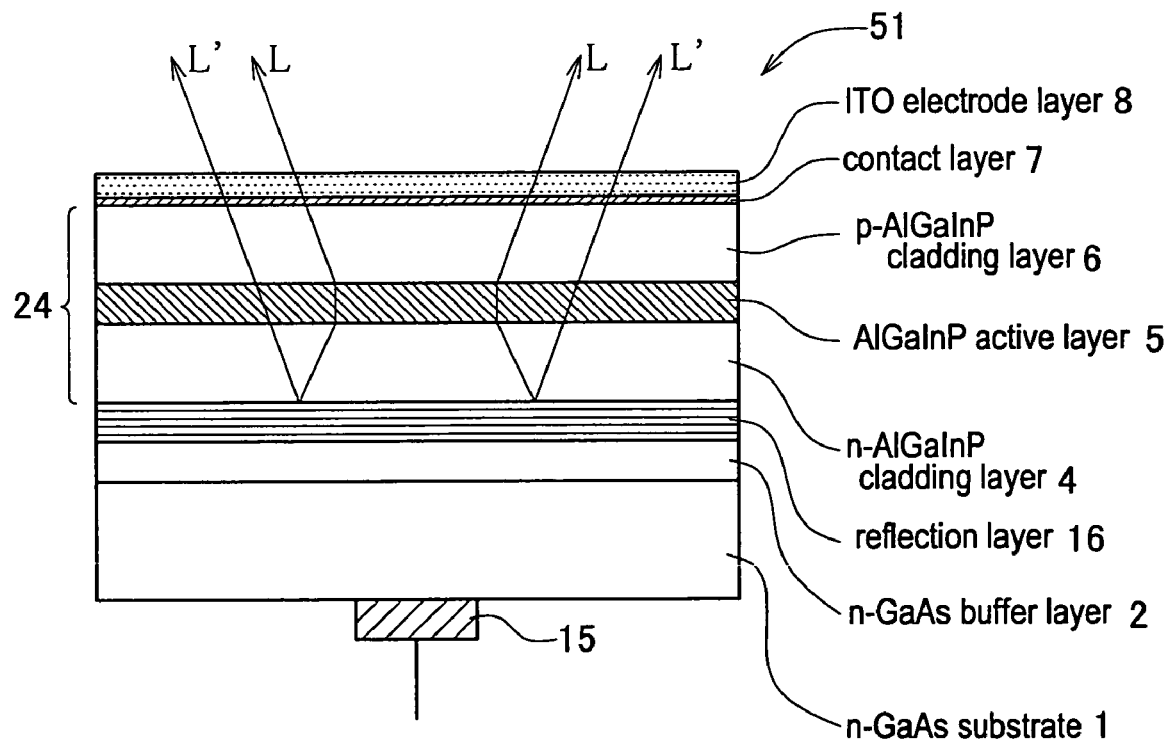
FIG. 12 is a schematic view showing an exemplary device configuration in which a light reflection layer is inserted on a second main surface side of a light extraction layer shown in FIG. 5.

It is also allowable, as exemplified by a light-emitting device 51 shown in FIG. 12, to insert a reflection layer 16, such as a semiconductor multi-layered film disclosed typically in Japanese Laid-Open Patent Publication "Tokkaihei" No. 7-66455, or metal layer composed of Au or Au alloy, between the GaAs substrate 1 and the light-emitting layer section 24. This is successful in raising the light extraction efficiency, because the light L directly leaks from the light-emitting layer section 24 towards the light extraction layer side is added with the reflected light L' from the reflection layer 16. In order to further reduce the total reflection loss, it is still also allowable to curve the boundary between the light-emitting layer section and the light extraction layer so as to convex it in the direction of the light extraction, as disclosed in Japanese Laid-Open Patent Publication "Tokkaihei" No. 5-190893.

Figure 13A:
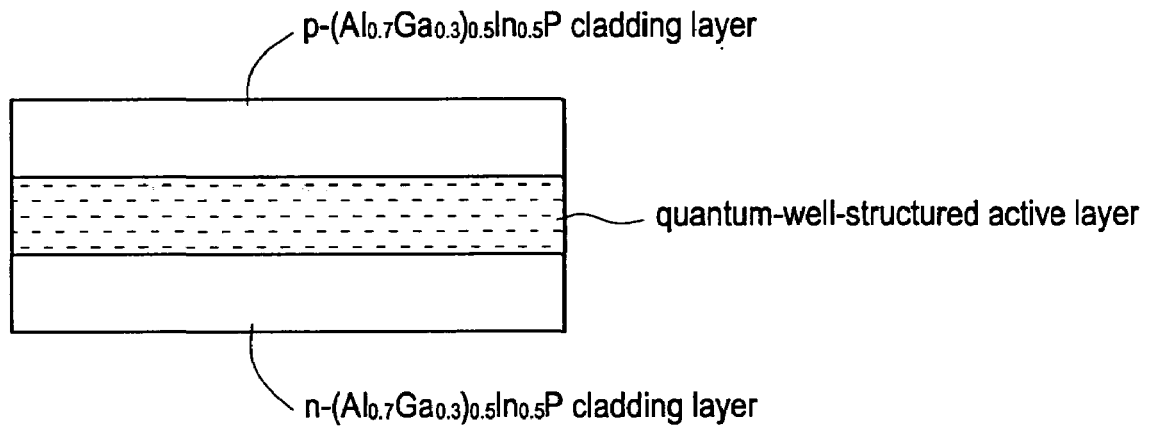
FIG. 13A is a first schematic view of an active layer having a quantum well structure.
Figure 13B:
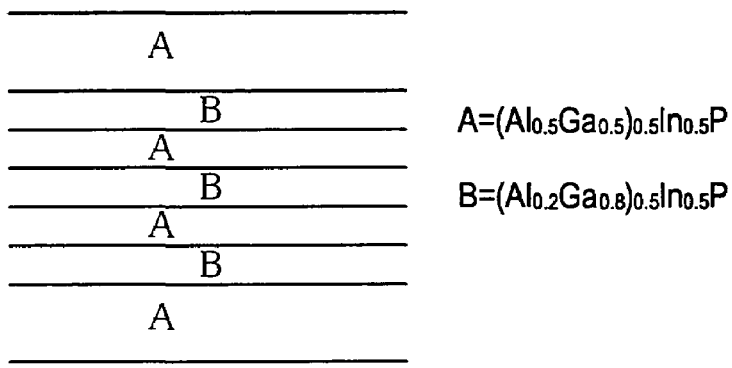
FIG. 13B is a second schematic view of an active layer having a quantum well structure.
Figure 13C:
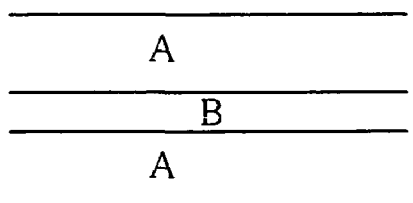
FIG. 13C is a third schematic view of an active layer having a quantum well structure.

The active layer 5 or 105 was configured as a single layer in the above-described embodiment, but may also be configured as a stack of a plurality of compound semiconductor layers differed in the band gap energies, and more specifically, as having a quantum well structure shown in FIG. 13A. The active layer having the quantum well structure is, as shown in FIG. 13B and FIG. 13C, a stack of two layers differed in the band gap energy thereof from each other through adjustment of the alloy compositions, that are a well layer B having a small band gap energy and a barrier layer A having a large band gap energy, each of which having a thickness not larger than the mean free path of electron therein (generally a single atomic layer to several tens of Angstroms), stacked in a lattice-matched manner. Because energy of electron (or hole) in the well layer B is quantized, the above configuration, applied to semiconductor laser devices and so forth, makes it possible to arbitrarily adjust the oscillation wavelength depending on the width or depth of the energy well layer, and is successful in stabilizing the oscillation wavelength, improving the emission efficiency, and lowering the oscillation threshold current density. This is also advantageous in that the difference in the lattice constants of as much as 2 to 3% can be tolerated because both of the well layer B and barrier layer A are extremely small in the thickness, and this facilitates expansion of the oscillation wavelength range. The quantum well structure herein may be a multiple quantum well structure having a plurality of well layers B as shown in FIG. 13B, or may be a single quantum well structure having only a single well layer B as shown in FIG. 13C. In FIGS. 13A to 13C, the p-type and n-type cladding layers are configured using $(Al_{0.7}Ga_{0.3})_{0.5}In_{0.5}P$ alloy, the barrier layer A using $(Al_{0.5}Ga_{0.5})_{0.5}In_{0.5}P$ alloy, and the well layer B using $(Al_{0.2}Ga_{0.8})_{0.5}In_{0.5}P$ alloy. It is to be noted that the thickness of the barrier layer A can be adjusted to 50 nm or around only for the layers in contact with the cladding layers, and can be adjusted to 6 nm for the other layers. The well layer B can be adjusted to 5 nm thick or around.

The invention claimed is:

1. A method of fabricating a light-emitting device having a light-emitting layer section configured as having a double heterostructure in which a first conductivity type cladding layer, an active layer, and a second conductivity type cladding layer, all of which being composed of $(Al_xGa_{1-x})_yIn_{1-y}P$ (where, $0 \leq x \leq 1$, $0 \leq y \leq 1$), are stacked in this order, and further comprising an ITO transparent electrode layer applying drive voltage for light-emission to the light-emitting layer section on at least either side of the first conductivity type cladding layer and the second conductivity type cladding layer, comprising the steps of:

forming a GaAs layer on the light-emitting layer section;
forming the ITO transparent electrode layer so as to contact with the GaAs layer to form a stack including the GaAs layer and the ITO transparent electrode layer; and
annealing the stack so as to allow In to diffuse from the ITO transparent electrode layer into the GaAs layer to thereby convert it into a contact layer composed of In-containing GaAs,
wherein the annealing is carried out so as to adjust a mean In concentration of the contact layer within a range from 0.1 to 0.6 on the basis of atomic ratio of In to the total concentration of In and Ga,
wherein the annealing is carried out so as to adjust $C_B/C_A$ to 0.8 or below, where $C_A$ is In concentration at a boundary position between the contact layer and the ITO transparent electrode layer, and $C_B$ is In concentration at a boundary position on the opposite side, and
wherein the light-emitting layer section is configured using $(Al_xGa_{1-x})_yIn_{1-y}P$ (where, $0 \leq x \leq 1$, $0.45 \leq y \leq 0.55$) to ensure lattice matching between the GaAs layer and the light-emitting layer section.

2. The method of fabricating a light-emitting device as claimed in claim 1, wherein the annealing is carried out at 600° C. to 750° C., both ends inclusive.

3. The method of fabricating a light-emitting device as claimed in claim 2, wherein process time of the annealing is set to 5 seconds to 120 seconds, both ends inclusive.

4. The method of fabricating a light-emitting device as claimed in claim 1, wherein thickness of the contact layer is adjusted within a range from 0.001 μm to 0.02 μm, both ends inclusive.

5. The method of fabricating a light-emitting device as claimed in claim 1, wherein the annealing is carried out so as to make an In concentration distribution in the thickness-wise direction of the contact layer continuously reduce as becoming more distant away from the ITO transparent electrode layer in the thickness-wise direction.

6. The method of fabricating a light-emitting device as claimed in claim 1, further comprising a step of forming, between the contact layer and either cladding layer of the first conductivity type cladding layer and the second conductivity type cladding layer located on the side of formation of the contact layer, an intermediate layer having an intermediate band gap energy between those of the contact layer and the cladding layer.

7. The method of fabricating a light-emitting device as claimed in claim 6, wherein the intermediate layer is formed as containing at least any one of an AlGaAs layer, a GaInP layer and an AlGaInP layer.

8. The method of fabricating a light-emitting device as claimed in claim 6, wherein the intermediate layer and the contact layer are formed over the entire surface of the light-emitting layer section in this order, and the ITO transparent electrode layer is formed so as to cover the entire surface of the contact layer.

9. A light-emitting device having a light-emitting layer section configured as having a double heterostructure in which a first conductivity type cladding layer, an active layer, and a second conductivity type cladding layer, all of which being composed of $(Al_xGa_{1-x})_yIn_{1-y}P$ (where, $0 \leq x \leq 1$, $0 \leq y \leq 1$), are stacked in this order; having an ITO transparent electrode layer applying drive voltage for light-emission to the light-emitting layer section on at least either side of the first conductivity type cladding layer and the second conductivity type cladding layer, so as to extract light from the light-emitting layer section through the ITO transparent electrode layer; and having a contact layer composed of In-containing GaAs, formed between the light-emitting layer section and the ITO transparent electrode layer, as being in contact with the ITO transparent electrode layer, wherein the contact layer is designed to have an In concentration distribution in a thickness-wise direction thereof continuously reducing as becoming more distant away from the ITO transparent electrode layer in the thickness-wise direction, wherein a mean In concentration of the contact layer is adjusted within a range from 0.1 to 0.6 on the basis of atomic ratio of In to the total concentration of In and Ga, wherein the contact layer is designed to have $C_B/C_A$ of 0.8 or below, where $C_A$ is In concentration at a boundary position between the contact layer and the ITO transparent electrode layer, and $C_B$ is In concentration at a boundary position on the opposite side, and wherein the light-emitting layer section is configured using $(Al_xGa_{1-x})_yIn_{1-y}P$ (where, $0 \leq x \leq 1$, $0.45 \leq y \leq 0.55$) to ensure lattice matching between a GaAs layer and the light-emitting layer section.

10. The light-emitting device as claimed in claim 9, wherein thickness of the contact layer is adjusted within a range from 0.001 μm to 0.02 μm, both ends inclusive.

11. The light-emitting device as claimed in claim 9, further comprising, between the contact layer and either cladding layer of the first conductivity type cladding layer and the second conductivity type cladding layer located on the side of formation of the contact layer, an intermediate layer having an intermediate band gap energy between those of the contact layer and the cladding layer.

12. The method of fabricating a light-emitting device as claimed in claim 2, wherein thickness of the contact layer is adjusted within a range from 0.001 μm to 0.02 μm, both ends inclusive.

13. The method of fabricating a light-emitting device as claimed in claim 2, wherein the annealing is carried out so as to make an In concentration distribution in the thickness-wise direction of the contact layer continuously reduce as becoming more distant away from the ITO transparent electrode layer in the thickness-wise direction.

14. The method of fabricating a light-emitting device as claimed in claim 2, further comprising a step of forming, between the contact layer and either cladding layer of the first conductivity type cladding layer and the second conductivity type cladding layer located on the side of formation of the contact layer, an intermediate layer having an intermediate band gap energy between those of the contact layer and the cladding layer.

15. The method of fabricating a light-emitting device as claimed in claim 14, wherein the intermediate layer is formed as containing at least any one of an AlGaAs layer, a GaInP layer and an AlGaInP layer.

16. The method of fabricating a light-emitting device as claimed in claim 14, wherein the intermediate layer and the contact layer are formed over the entire surface of the light-emitting layer section in this order, and the ITO transparent electrode layer is formed so as to cover the entire surface of the contact layer.

17. The method of fabricating a light-emitting device as claimed in claim 7, wherein the intermediate layer and the contact layer are formed over the entire surface of the light-emitting layer section in this order, and the ITO transparent electrode layer is formed so as to cover the entire surface of the contact layer.

18. The method of fabricating a light-emitting device as claimed in claim 15, wherein the intermediate layer and the contact layer are formed over the entire surface of the light-emitting layer section in this order, and the ITO transparent electrode layer is formed so as to cover the entire surface of the contact layer.

* * * * *